United States Patent [19]

Cazaux et al.

[11] Patent Number: 4,878,103
[45] Date of Patent: Oct. 31, 1989

[54] CHARGE TRANSFER MEMORY AND FABRICATION METHOD THEREOF

[75] Inventors: Yvon Cazaux, Grenoble; Didier Herault, Seyssinet; Yves Thenoz, Grenoble; Pierre Blanchard, Echirolles, all of France

[73] Assignee: Thomson-CSF, Paris, France

[21] Appl. No.: 297,651

[22] Filed: Jan. 17, 1989

[30] Foreign Application Priority Data

Jan. 19, 1988 [FR] France .................. 88 00542

[51] Int. Cl.[4] .................. H01L 29/78; G11C 19/28
[52] U.S. Cl. .................. 357/24; 377/61
[58] Field of Search .................. 357/24; 377/57-63

[56] References Cited

U.S. PATENT DOCUMENTS

| | | |
|---|---|---|
| 3,852,799 | 12/1974 | Walden .................. 357/24 |
| 4,159,430 | 6/1979 | Boudewijns et al. .................. 357/24 |
| 4,262,217 | 4/1981 | Levine .................. 357/24 |
| 4,621,369 | 11/1986 | Narabu et al. .................. 357/24 |
| 4,625,322 | 11/1986 | Tukazaki et al. .................. 357/24 |
| 4,654,865 | 3/1987 | Sunazuka et al. .................. 357/24 |
| 4,740,908 | 4/1988 | Berger et al. .................. 364/829 |
| 4,777,519 | 10/1988 | Oshima .................. 357/24 |

OTHER PUBLICATIONS

Patent Abstracts of Japan, vol. 9, No. 285, (P-404) [2008], Nov. 12, 1985.

Primary Examiner—Gene M. Munson
Attorney, Agent, or Firm—Oblon, Spivak, McClelland, Maier & Neustadt

[57] ABSTRACT

A charge transfer memory and its fabrication method are disclosed. The memory has charge transfer shift registers, with four phases and two level of electrodes, and a reading register with two phases and three levels of electrodes. At one end of each shift register, there is a final electrode contiguous with a reading storage electrode of the reading register, which is itself contiguous to a reading transfer electrode. These electrodes are made in a layer, with a second type of doping, of a semiconductor substrate with a first type of doping. Zones with a third type of doping are made facing the transfer electrodes of the reading register. According to the invention, facing the final electrode of each shift register, a zone with a fourth type of doping is made. This zone with a fourth type of doping prevents charges flowing in the reading register from returning to a shift register.

2 Claims, 5 Drawing Sheets

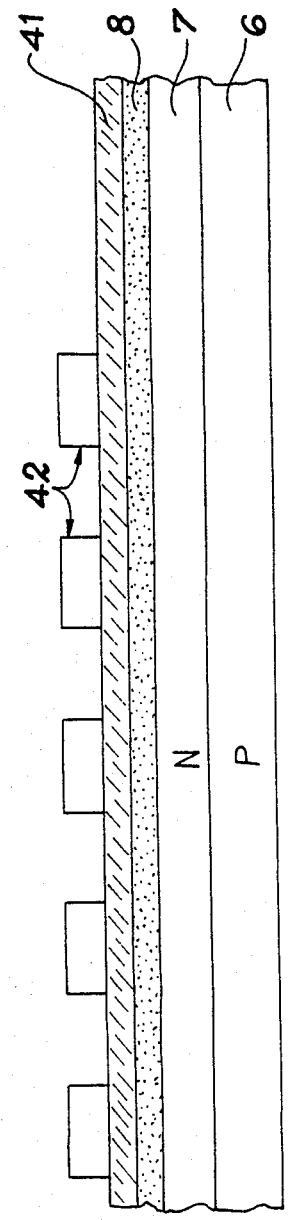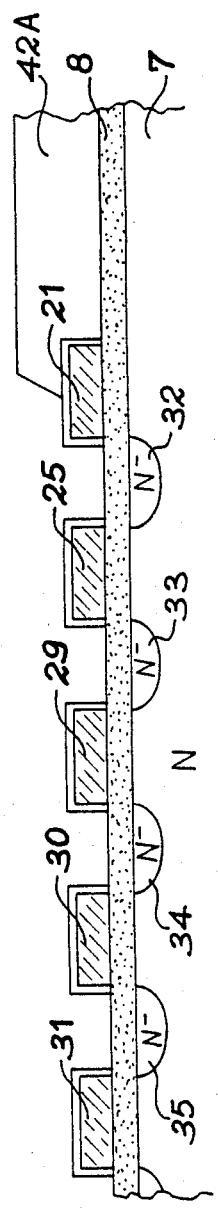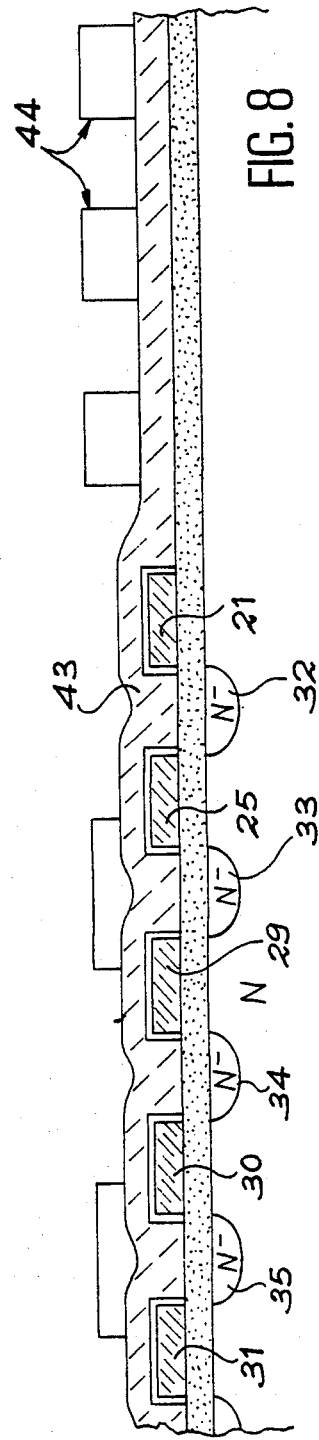

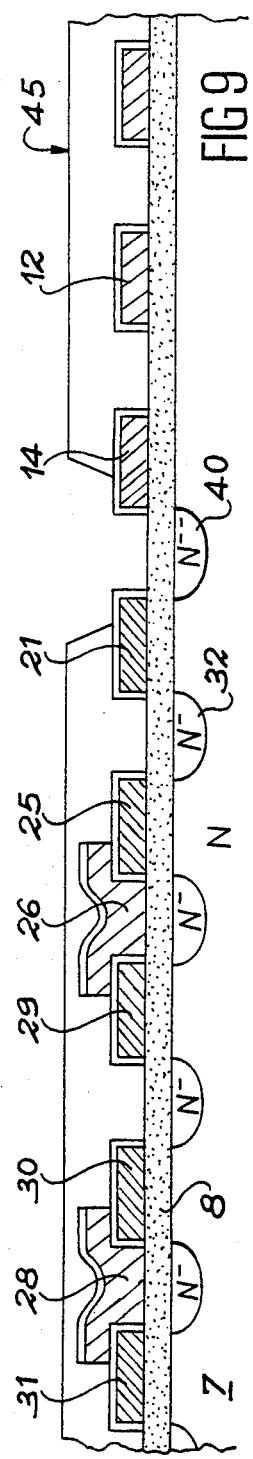
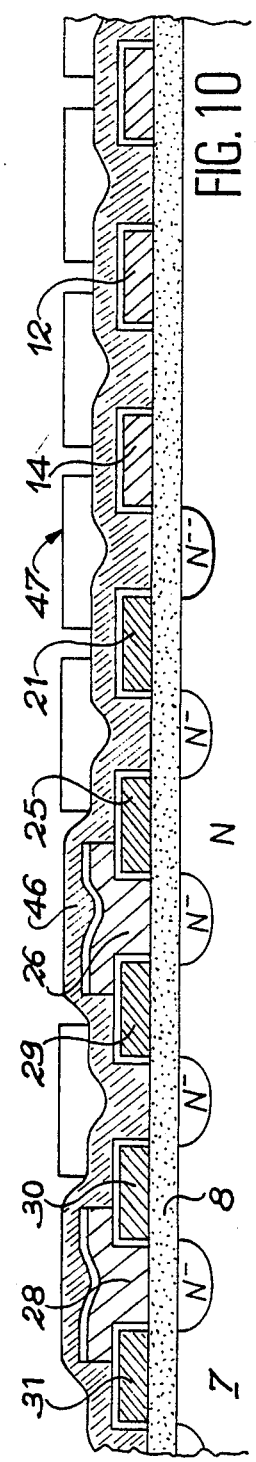
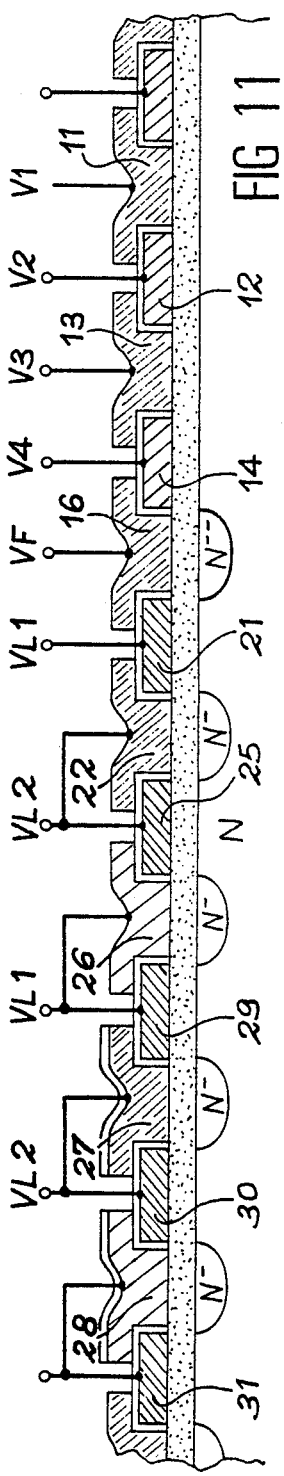

CHARGE TRANSFER MEMORY AND FABRICATION METHOD THEREOF

BACKGROUND OF THE INVENTION

1. Field of the Invention

The present invention concerns a charge transfer memory as well as a method for the fabrication of this memory.

It can be applied notably to photosensitive matrices used in video systems. In this type of application, the charges stored in the memory come from photosensitive elements. The invention more particularly concerns the transfer of charges stored in shift registers to a reading register.

2. Description of the Prior Art

Charge transfer memories, whether used to record charges coming from photosensitive elements or to record charges generated by any other means, generally have, in a known way, a succession of charge transfer shift registers in which the stored charges are transferred towards one of ends, called the final end, of each of these registers, to be transferred a reading register which itself works as a charge transfer shift register. The charges thus transferred from the shift registers to the reading register are read at the end of this reading register by a measuring amplifier.

The shift registers used in this memory are parallel to a first direction. These registers are generally of the type with "four phases and two levels of integration of electrodes or of polycrystalline silicon". The reading register is parallel to a second direction which is perpendicular to the first direction. As shall be seen in detail further below, this register is, in the case of the invention, is of the type with "two phases and three levels of polycrystalline silicon".

FIG. 1 gives a schematic view, in perspective, of a charge transfer memory having, in a known way, shift registers and a reading register with transfer of charges.

The shift registers are designated by the references 1, 2, 3, 4 and the reading register is designated by reference 5. The number of shift registers has been limited to four to make it easier to represent them. These shift registers are parallel to a first direction Y while the reading register 5 is parallel to a second direction X which is itself preferably perpendicular to the first direction Y.

The shift registers and the reading register are made on a semiconductor substrate 6, with a first type (P type for example) of doping, which supports a semiconductor layer 7 with a second type of doping (N type for example). An insulating layer 8 covers the semiconductor layer 7.

Parallel to the axis Y, each shift register has successive groups of electrodes. Only one group of four electrodes 9 has been shown as an example for the register 1. It is clear that this register has other groups identical to the group 9, aligned with it in the direction Y. Each of these groups has four electrodes, 11, 12, 13 and 14, for the transfer and storage of charges. These electrodes are arranged in series and are in contact with the insulating layer 8. They enable the charges to flow, in a known way, in a pre-determined direction indicated by the arrow 15, by means of transfer potentials and potential wells which appear beneath the electrodes of each group at the interface between the semiconductor layer 7 and the insulating layer 8 when the cyclical voltages, $V_1$, $V_2$, $V_3$, $V_4$, are respectively applied to the four electrodes of each group. These voltages respectively have different phases and equal extreme values. The charges are thus transmitted from one group to another, in the direction of the arrow 15, to be brought to one end of each shift register which ends with a final transfer electrode 16. This final electrode is carried to a cyclical potential having, for example, the same phase and the same extreme values as the voltage $V_1$ applied to the first electrode 11 of the group.

The reading register 5 has, along the second axis X, for each shift register, and to make the charges always flow in one and the same direction, as defined by the arrow 17, a pair of reading electrodes in contact with the insulating layer 8.

Each of the pairs of reading electrodes has, for example, for the shift register 2, in order to transfer the charges stored beneath the final electrode 19 of this register, a storage electrode 18, called a reading electrode, contiguous to the final electrode 19 of the shift register 2 considered, and a transfer electrode 20, called a reading electrode, contiguous to the reading storage electrode 18. This transfer electrode is also contiguous to a reading storage electrode 21, corresponding to the final electrode 16 of the adjacent shift register 1, in the sequence of registers and in the direction 17 of the transfer of charges in the reading register.

In a known way, the pairs of successive electrodes 20, 21 and 18, 23 of reading register 5 are respectively powered by cyclical voltages VL1, VL2 which are in phase opposition and have the same extreme values.

FIG. 2 gives a schematic sectional view XOY of the memory of FIG. 1. The structure of this memory is shown herein in greater detail and as in the prior art. The same references are repeated for the same elements in this figure and in FIG. 1.

This FIG. 2 again shows the semiconductor layer 7, with a second type of doping (N type for example), the insulating layer 8 and, on this insulating layer, certain electrodes of the reading register 5 and certain electrodes of the shift register 1. Thus, there are shown, the electrodes 11, 12, 13, 14 of this shift register 1 to which there are applied the phase-shifted voltages V1, V2, V3, V4. This figure also shows the final electrode 16 of this shift register, to which there is applied the voltage VF, the storage electrode 21 of the reading register 5, the transfer electrode 22 which is contiguous to this storage electrode 21, as well as the next storage electrode 25. This figure also shows other transfer electrodes 26, 27, 28 and other storage electrodes 29, 30, 31 of the reading register. The pairs of electrodes such as 21, 22, 25, 26,.. of the reading register are supplied with the voltages VL1, VL2 mentioned further above.

Semiconductor zones with a third type of doping (N type for example), shown at 32, 33, 34 and 35 in the figure, are made facing the transfer electrodes 22, 26, 27, 28, . . . of the reading register.

Charges coming from the shift registers flow in this reading register by means of potential wells and transfer potentials that appear beneath the successive pairs, such as 22–25,. . ., of electrodes of the reading register.

FIG. 3 is a graph of the potentials V which appear at the interface between the semiconductor layer 7 and the insulating layer 8, when the above-mentioned potentials are applied to the electrodes of the shift register and to the electrodes of the reading register. For each of the phases $\phi_1$, $\phi_2$ of the voltages VL1, VL2 applied, the successive pairs of electrodes of the reading register, these potentials show potential wells P1, P2, P3 with a depth VA, and transfer potential "landings" or stages with values VB, VC, VD.

These wells and transfer potentials enable the charges to be conveyed into the reading register in the direction of the arrow 17 for example. These charges come from a potential well P4 of the shift register. In this shift register, these charges are conveyed to the ends of each shift register through the application of the potentials V1, V2, V3, V4 to the different electrodes, and through the application of the potential VF to the final electrode 16 of this register (VF=V1).

The transfer potential, of the level VC, resulting from the application of the potential VF to the final electrode 16 of the shift register, has a higher level than the transfer potential VD resulting from the application of the potential VL1 to the electrode 21.

The result thereof is that the charges (electrons in the example considered) are normally transferred from the potential well P4, present beneath the storage electrode 14 of the shift register, to the potential well P0, present beneath the storage electrode 21 of the reading register. The transfer potential VC created by the voltage VF applied to the final electrode 16 is the same as the one which creates the potential well P0 during the transfer, and electrons present in the well P1 of the reading register can return to the well P4 of the shift register (it must be noted that the axis V of the voltages points downwards). In fact, once the reading register is charged, the voltage VF remains in the low state and the potentials VL1 and VL2 are controlled between the low and high levels in order to remove the charges to the reading register output (arrow 17 in FIG. 1). It is during this shift that the charges can rise again towards the shift register.

The fact that charges flowing in the reading register might return to a shift register is a very serious drawback in this type of prior art register.

SUMMARY OF THE INVENTION

The invention is precisely aimed at overcoming this drawback and, notably, at making a charge transfer memory wherein the charges which flow in a reading register absolutely cannot return to the shift registers connected to this reading register. These aims are achieved in a very simple way, as shall be seen further below in greater detail, by implanting a doped zone beneath the final electrode of each shift register in the semiconductor layer. This doped zone is of the same type (N⁻ for example) as the doped zones (N⁻) of the reading register, but has a lower level of doping. Another aim of the invention is to provide a simple method for the fabrication of a memory of this type, wherein the shift registers are registers of the type with "four phases and two levels of polycrystalline silicon or of electrodes", and wherein the reading register is of the type with "two phases and three levels of polycrystalline silicon or of electrode".

An object of the invention is a charge transfer memory comprising a succession of charge transfer shift registers, said to have "four phases and two levels of electrodes", and a register for the reading of the charges of shift registers, said to have "two phases and three levels of electrodes", said shift registers and said reading register being made on a semiconductor substrate, with a first type of doping, supporting a semiconductor layer with a second type of doping, said layer being itself covered with an insulating layer, each shift register further comprising, parallel to a first axis, successive groups of electrodes, each group comprising three transfer electrodes and one charge storage electrode, in contact with the insulating layer, to make the charges flow in a pre-determined direction, through transfer potentials and potential wells appearing under these electrodes, in relation with the four phases of cyclical voltages with identical values, respectively applied to the electrodes of each group, the charges being thus conveyed to an end of the shift register which ends in a final transfer electrode, carried to a pre-determined potential, said reading register comprising, along a second axis, for each shift register, and in order to make the charges flow always in one and the same direction along the second axis, at least one pair of reading electrodes, said pair being in contact with the insulating layer and comprising a reading storage electrode contiguous to the final electrode of the shift register considered, and a reading transfer electrode contiguous to the reading storage electrode corresponding to the shift register considered, said reading transfer electrode being also contiguous to a reading storage electrode corresponding to a final electrode of a shift register adjacent to the considered register in said succession of shift registers, semiconductor zones with a third type of doping being made so as to respectively face the transfer electrodes of the reading register, the charges flowing in this register by means of potential wells and transfer potentials appearing beneath the successive pairs of electrodes, each pair of reading electrodes corresponding to a shift register, being supplied with a cyclical voltage having equal values but in phase opposition with a cyclical voltage supply the pair of reading electrodes of the adjacent shift register in said succession, wherein each shift register further has a zone with a fourth type of doping made in the layer with the second type of doping, facing the final electrode.

According to another characteristic of the invention, the semiconductor substrate with the first type of doping has P type doping, the semiconductor layer with the second type of doping has N type doping, the zones with the third type of doping have N type doping, and have a lower level of doping than that of the semiconductor layer with the second N type doping, each zone with the fourth type of doping having N⁻type doping and having a lower level of doping than that of the zones with the third type N⁻type of doping.

The invention also concerns a method for the fabrication of a charge transfer memory, said method consisting:

in the making of storage electrodes of the reading register by masking and etching of a first layer of polycrystalline silicon, called first level polycrystalline silicon, deposited on the insulating layer, then in the implanting of said zones, with the third type of doping, between the storage electrodes of the reading register, in the semiconductor layer with the second type of doping, then in the making of transfer electrodes of the reading register, and storage electrodes and transfer electrodes of the shift registers, by masking and etching of a second layer of polycrystalline silicon, called second level polycrystalline silicon, deposited on the already made electrodes in the first layer and on the insulating layer, said method consisting then in:

making a zone with a fourth type of doping in the semiconductor layer with the second type of doping, facing spaces which respectively correspond to the final electrodes of the shift registers, then in making other transfer electrodes of the reading register and other transfer and storage electrodes of the shift registers, as well as the final electrodes of the shift registers, by masking and etching of a third layer of polycrystalline silicon, called third level polycrystalline silicon, deposited on the electrodes already made in the first and second layers of polycrystalline silicon and on the insulating layer.

BRIEF DESCRIPTION OF THE DRAWINGS

The features and advantages of the invention will be seen more clearly from the following description, made with reference to the appended drawings, of which:

FIGS. 6 to 11 give a schematic view of the essential steps in the method for fabrication of the memory of the invention.

DESCRIPTION OF A PREFERRED EMBODIMENT

Figure 1:
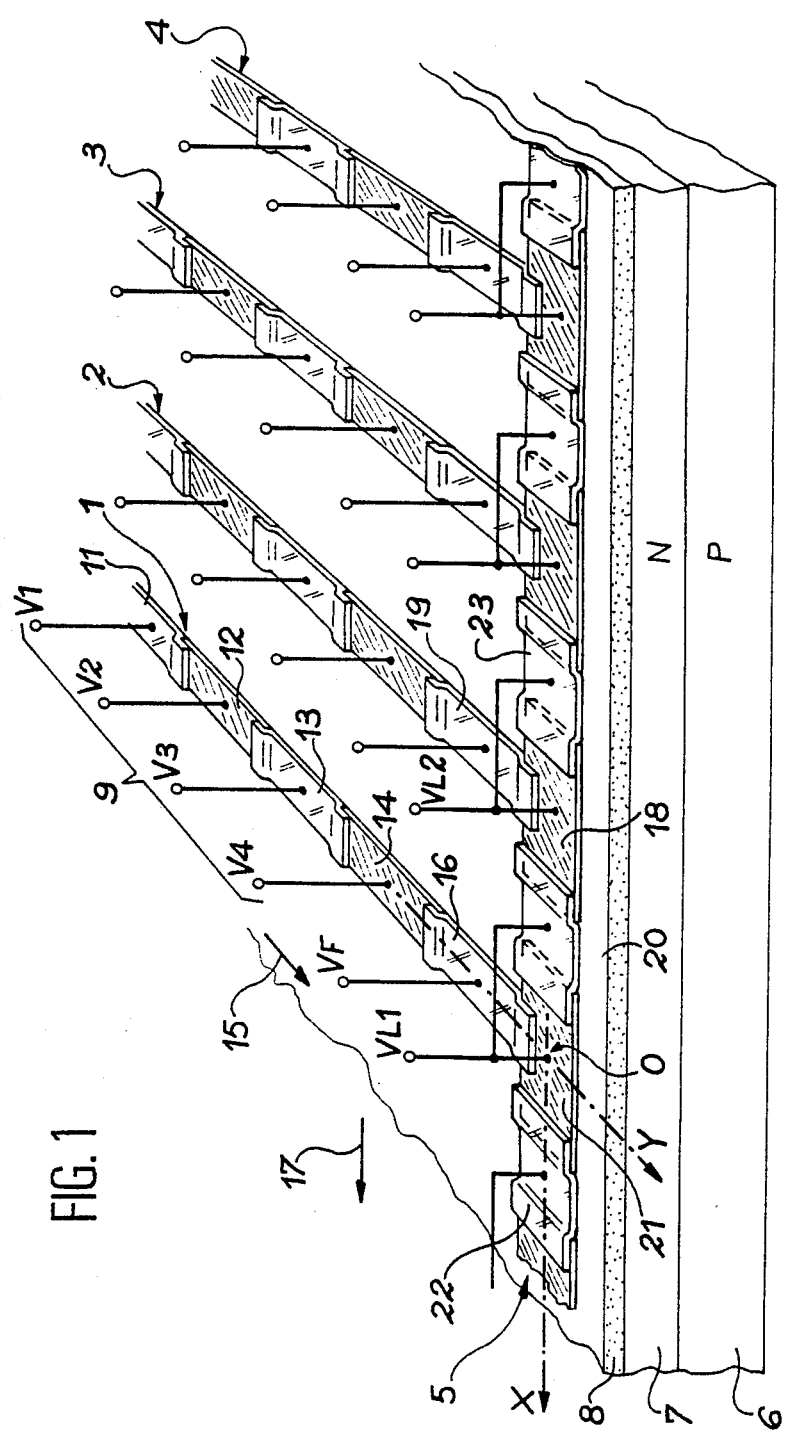
FIG. 1, which has already been described, gives a general schematic view in perspective of the main electrodes of the shift registers and a reading register of a memory known in the prior art; this general view also corresponds to that of the memory of the invention.
Figure 4:
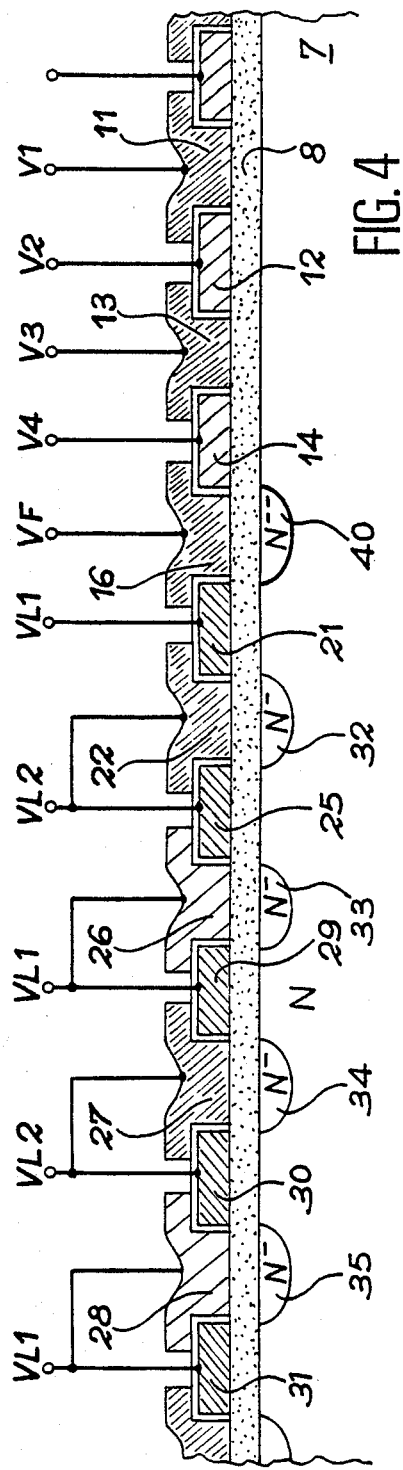
FIG. 4 gives a schematic view, along a section XOY, of the memory of FIG. 1 in the case of the invention.

FIG. 4 gives a schematic view, along a section XOY, of the memory FIG. 1 in the case of the invention. The same references are repeated for the same elements in this figure and in FIG. 2.

Figure 2:
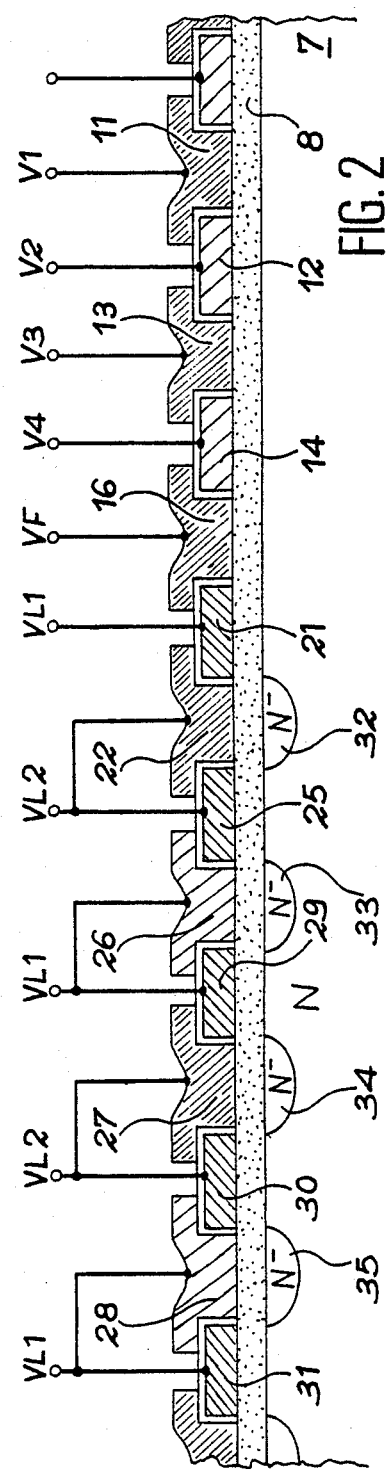
FIG. 2 has already been described and gives a schematic view along section XOY of the structure of the memory of FIG. 1 known in the prior art.

As in the memory of FIG. 2, the electrodes of each shift register and of the reading register lie on an insulating layer 8 superimposed on a semiconducting layer 7 with a second type (N type in the preferred embodiment of the invention) of doping. Said semiconductor layer with a second type of doping itself lies on a semiconductor substrate with a first type (P type in a preferred embodiment of the invention) of doping, not shown in this figure. Semiconducting zones 32, 33, 34, 35,... with a third type of doping (N⁻type in the preferred embodiment of the invention) with doping of a lower level than that of the semiconductor layer 7, are implanted so as to face the transfer electrodes 22, 26, 27, 28 of the reading register. As in FIG. 2, this FIG. 4 also shows the voltages V1, V2, V3, V4 which are respectively applied to the transfer and storage electrodes 11, 12, 13, 14 of one of the groups of electrodes of a shift register, as well as the voltage VF applied to the final electrode 16 of the register considered (register 1 in FIG. 1). As with the memory of FIG. 2, these voltages are, of course, cyclical and phase-shifted and have identical extreme values.

The phase of the voltage VF is identical to the phase of the voltage V1.

The references VL1, VL2 also designate cyclical voltages VL1 and VL2, with identical extreme values, applied to the pairs of electrodes such as 22,25, 26,29,... of the reading register 5. As in the memory of FIG. 2, these voltages are in phase opposition.

According to the invention, and for a purpose which shall be explained in detail further below, the memory has, facing the final electrode 16 of each shift register, a zone implanted with a fourth type (N⁻type in the preferred embodiment of the invention) of doping, with a lower level of doping than that of the zones implanted with a third type of doping (namely the zones 32). This zone 40 makes it possible, with respect to the voltage VF applied to the electrode 16 of the shift register considered, to reduce the potential of charge transfers between the shift register and the reading register. This reduction in potential, especially in the preferred embodiment of the invention, prevents charges (electrons) present in the reading register from rising again to the corresponding shift register.

Figure 3:
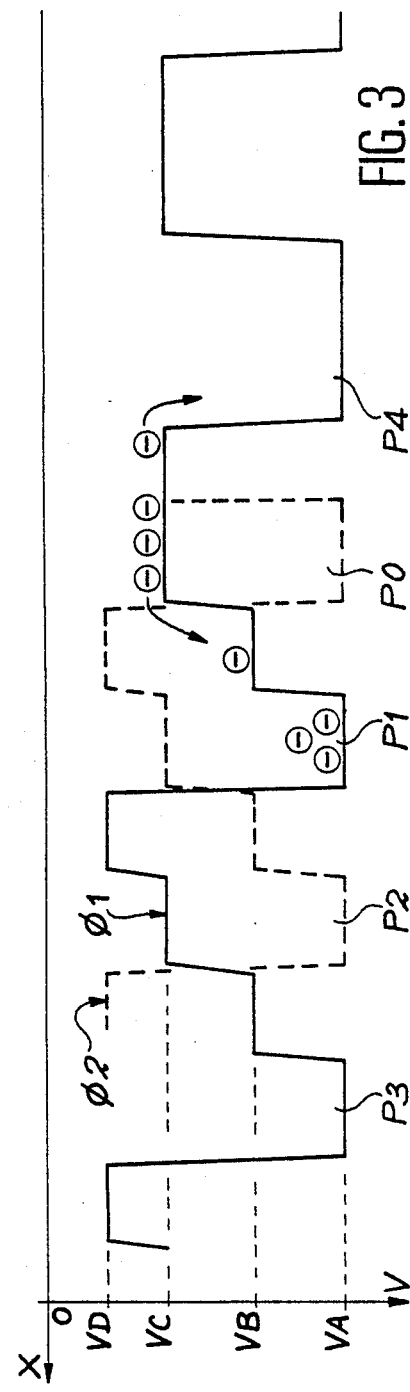
FIG. 3 has already been described and schematically represents a graph of the potentials that appear at the interface between the semiconductor layer and the insulating layer for the reading register and for one of the shift registers of the memory of FIG. 2.
Figure 5:
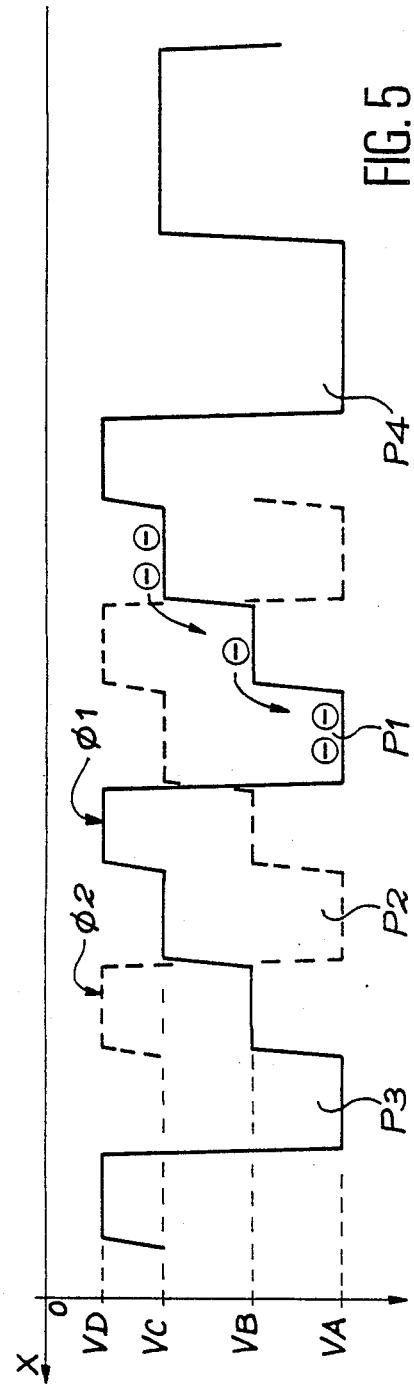
FIG. 5 is a graph giving a schematic view of the potentials that come into play at the interface between the semiconductor layer and the insulating layer for one of the shift registers and for the reading register, in the memory of FIG. 4 according to the invention.

FIG. 5 gives a schematic view of a graph of potentials V appearing at the interface between the semiconductor layer 7 and the insulating layer 8 in the memory of the invention, as shown in FIG. 4. This graph reveals the potential wells and the transfer wells for the reading register 5 and for the shift register 1. As in FIG. 3, this FIG. 5 shows potential wells P1, P2, P3, P4 with a depth VA and transfer potential landings or stages appearing beneath the pairs of electrodes of the reading register and beneath the electrodes of the shift register, for the phase-shifted voltages VL1, VL2, VF, V1, V2, V3, V4. The curves $\phi 1$, $\phi 2$ respectively represent these wells and transfer potentials for each of these phase-shifted voltages.

It is seen, in this figure, that the potential stage or landing with a value $V^D$, beneath the final electrode 16 of the shift register 1, has a value below that of the value VC of the corresponding stage or landing of the memory of FIG. 2 (the prior art memory). This result is obtained through the implanting of the zone 40, with a fourth type of doping, beneath the final electrode 16. This lower value of the potential stage or landing beneath the final electrode 16 makes it possible to prevent electrons contained in the potential well P1 for example, when this well contains a large number of electrons, from returning towards the shift register 1, i.e. to the potential well P4.

FIGS. 6 to 11 give a schematic view of the essential steps of the method for the fabrication of the memory of the invention.

As shown in FIG. 6, the method consists firstly in the deposition of a first layer 41 of a polycrystalline silicon, called first level polycrystalline silicon, on an insulating layer 8 superimposed on a semiconductor layer 7 with N type doping, itself superimposed on a semiconductor substrate 6 with preferably P type doping preferably. Then, the storage electrodes such as 21, 25, 29, 30, 31 of the reading register (the register 5 in FIG. 1) are cut out by masking (mask 42) and by etching.

The electrodes thus obtained are shown in FIG. 7. In the next step, zones implanted with a third type of doping (N⁻type) are made in the semiconductor layer 7 with a second type of doping (N type), between the already made storage electrodes 21, 25, 29, 30, 31. These zones with a third type of doping are shown at 32, 33, 34, 35 in FIG. 7. It is assumed that the storage electrodes already made are coated with an insulating layer made in a known way and that a resin mask 42A shields the zones of the semiconductor layer where it is not desired to make implantations of the third type of doping.

Then, as shown in FIG. 8, there is deposited, on the already made electrodes and on those parts of the insulating layer 8 which are not covered, a layer 43 of a polycrystalline silicon called second level polycrystalline silicon. Then, certain transfer electrodes such as 26, 28 of the reading register 5 as well as certain storage and transfer electrodes such as 12, 14 of the shift registers are cut out by masking.

These second level electrodes can be seen in FIG. 9. Then, a doped zone 40 with a fourth type (type $N^-$ in the preferred embodiment of the invention) of doping, with a lover level of doping than that of the zones 32 with a third type (type $N^-$) of doping, is made in the semiconductor layer 7 with the second type of doping, facing the spaces corresponding to the final electrodes of the shift registers. For this implanting operation, the already made electrodes are covered with an insulating layer and shielded by a mask 45.

Then, as shown in FIG. 10, a third layer 46 of polycrystalline silicon, called third level polycrystalline silicon, is deposited on the already made electrodes in the layers 41, 43 of silicon of the first and second levels and on those parts of the insulating layer 8 which are not coated with these electrodes. Then, by masking (mask 47) and by etching this third layer of polycrystalline silicon 46, an operation is conducted to make other transfer electrodes such as 22, 23 of the shift registers, the final electrodes 16 of the shift registers as well as the lacking storage and transfer electrodes 11, 13 of the shift registers. These electrodes can be seen in FIG. 11.

Then, the connection wires used to connect the electrodes to supply sources giving the voltages V1, V2, V3, V4, VF, VL1, VL2 are positioned.

The fabrication method just described clearly shows that this memory has shift registers working with voltages V1, V2, V3, V4, VF having different phases and that these registers have two levels of integration, namely the second and third levels 43, 46 of polycrystalline silicon (the electrode 14 for example belongs to the second level while the electrode 13 belongs to the third level).

The reading register 5 is a register that works through two control voltages VL1, VL2 in phase opposition, applied to pairs of electrodes of this register. This reading register may be called a register with three levels of integration since the different electrodes that form it are made in the first level 41 of polycrystalline silicon (the electrode 29 for example), in the second level 43 of polycrystalline silicon (electrode 28 for example) and in the third level 46 of polycrystalline silicon (electrode 23 for example).

What is claimed is:

1. A charge transfer memory comprising a succession of charge transfer shift registers said to have "four phases and two levels of electrodes" and a register for the reading of the charges of the shift registers, said to have "two phases and three levels of electrodes", said shift registers and said reading register being made on a semiconductor substrate, with a first type of doping, supporting a semiconductor layer with a second type of doping, said layer being itself covered with an insulating layer, each shift register further comprising, parallel to a first axis, successive groups of electrodes, each group comprising four electrodes for the transfer and storage of charges, in contact with the insulating layer, to make the charges flow in a pre-determined direction, through transfer potentials and potential wells appearing under these electrodes, in relation with the four phases of cyclical voltages with identical values, respectively applied to the electrodes of each group, the charges being thus conveyed to an end of the shift register which ends in a final transfer electrode, carried to a pre-determined potential, said reading register comprising, along a second axis, for each shift register, and in order to make the charges flow always in one and the same direction along the second axis, at least one pair of reading electrodes, said pair being in contact with the insulating layer and comprising a reading storage electrode, contiguous to the final electrode of the shift register considered, and a reading transfer electrode contiguous to the reading storage electrode corresponding to the shift register considered, said reading transfer electrode being also contiguous to a reading storage electrode corresponding to a final electrode of a shift register adjacent to the considered register in said succession of shift registers, semiconductor zones with a third type of doping being made so as to respectively face the transfer electrodes of the reading register, the charges flowing in this register by means of potential wells and transfer potentials appearing beneath the successive pairs of electrodes, each pair of reading electrodes corresponding to a shift register, being supplied with a cyclical voltage having equal values but in phase opposition with a cyclical voltage supplying the pair of reading electrodes of the adjacent shift register in said succession, wherein each shift register further has a zone with a fourth type of doping made in the layer with the second type of doping, facing the final electrode.

2. A memory according to claim 1, wherein the semiconductor substrate with the first type of doping has P type doping, the semiconductor layer with the second type of doping has N type doping, the zones with the third type of doping have $N^-$ type doping, and have a lower level of doping than that of the semiconductor layer with the second N type doping, each zone with the fourth type of doping having $N^-$ type doping and having a lower level of doping than that of the zones with the third type $N^-$ type of doping.

* * * * *